United States Patent [19]
Chen et al.

[11] Patent Number: 6,066,836
[45] Date of Patent: *May 23, 2000

[54] HIGH TEMPERATURE RESISTIVE HEATER FOR A PROCESS CHAMBER

[75] Inventors: Steven Aihua Chen, Fremont; Henry Ho, San Jose; Mei Chang, Saratoga; Ming Xi, Santa Clara; Chen-An Chen, Sunnyvale; Chiliang Chen, Cupertino, all of Calif.

[73] Assignee: Applied Materials, Inc., Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/717,780

[22] Filed: Sep. 23, 1996

[51] Int. Cl.⁷ .............................. F27B 5/14; C23C 16/00
[52] U.S. Cl. .......................... 219/390; 392/416; 392/418; 432/253; 118/725
[58] Field of Search ..................................... 392/416, 418; 219/405, 411, 390; 432/241, 253; 118/725

[56] References Cited

U.S. PATENT DOCUMENTS

| | | | |
|---|---|---|---|
| 4,798,926 | 1/1989 | Sakai | 219/405 |
| 5,060,354 | 10/1991 | Chizinsky | 29/25.02 |
| 5,127,365 | 7/1992 | Koyama | 219/405 |
| 5,314,839 | 5/1994 | Mizutani et al. | 437/173 |
| 5,315,092 | 5/1994 | Takahashi | 392/418 |
| 5,444,217 | 8/1995 | Moore | 219/405 |
| 5,470,389 | 11/1995 | Ishihara et al. | 188/719 |
| 5,482,559 | 1/1996 | Imai | 432/241 |
| 5,520,743 | 5/1996 | Takahasi | 118/730 |
| 5,533,736 | 7/1996 | Yamaga | 219/390 |
| 5,556,275 | 9/1996 | Sakata | 432/241 |
| 5,592,581 | 1/1997 | Okase | 219/405 |
| 5,662,470 | 9/1997 | Huussen | 219/390 |
| 5,683,518 | 11/1997 | Moore | 219/411 |
| 5,788,778 | 9/1996 | Shang et al. | 134/1 |

*Primary Examiner*—Teresa Walberg
*Assistant Examiner*—Daniel Robinson
*Attorney, Agent, or Firm*—Blakely Sokoloff Taylor & Zafman

[57] ABSTRACT

A resistive heating structure for a processing apparatus such as a chemical vapor deposition chamber. The system includes a resistive heating substrate holder including a support surface and a support shaft, the holder being comprised of a first material. The support surface includes a resistive heating element. The support shaft has a given length, and through bores for allowing a thermocouple to engage the support surface and electrical conductors to couple to the resistive heating element in the support surface. A metallic mounting structure is coupled to the support shaft and secured to the process apparatus to create a sealed environment within the holder and mounting structure to protect the electrical leads and thermocouple from the process environment.

38 Claims, 7 Drawing Sheets

HIGH TEMPERATURE RESISTIVE HEATER FOR A PROCESS CHAMBER

This is a Continued Prosecution Application (CPA) of Ser. No.: 08/717,780 Filed: Sep. 23, 1996.

BACKGROUND OF THE INVENTION

1. Field of the Invention

The invention relates to heating mechanisms for process chambers, particularly chemical vapor deposition chambers.

2. Description of the Related Art

Chemical vapor deposition (CVD) is a popular process for depositing various types of films on substrates and is used extensively in the manufacture of semiconductor integrated circuits. In CVD processing, chemicals containing atoms required in the final film are mixed and reacted in a deposition chamber. The elements or molecules deposit on the substrate surface and build up to form a film. The substrate upon which the film is to be deposited is usually mounted on a susceptor which, depending on the type of CVD process, can be comprised of a variety of materials. A susceptor preferably will have good thermal conductivity and a high resistance to thermal deformation. Aluminum, for example, is a popular susceptor material with good thermal conductivity, but which is too fragile to withstand high temperatures. Hence, susceptors made of glass carbon or graphite coated with aluminum nitride (AlN) have become popular.

There are two basic types of heating schemes used in CVD systems which are distinguished based upon how the susceptor is heated: resistive heating schemes utilize a resistive heating element to directly heat the wafer and produce a reaction which is more localized at the wafer. Lamp heating schemes use a radiant heating lamp which heats the substrate, susceptor and chamber and produces a reaction which is present throughout the chamber.

In a lamp heated system, the substrate is carried on a susceptor and heat is transferred to the substrate by the lamps positioned behind heat resistant protective glass in the chamber. In a resistive heating system, resistive heating elements are located in the wafer holder. In general, resistive heating systems allow more accurate control of the process occurring in the chamber. In lamp heating systems, for example, the heat resistant glass behind which the radiant heaters are positioned will itself become coated with the materials used in the process chamber. The products of the process will deposit on the glass, reducing the effectiveness of the lamp heaters and corroding the glass after repeated processing.

Further, in CVD systems, a thermocouple is connected to the substrate holder to measure thermal variations of the holder under processing. In a lamp heated system, the thermocouple must be in the chamber. In a resistive heating system, the thermocouple can be placed in a controlled environment within the stem holding the heating element. This adds to the life of the thermocouple and increases the accuracy of the thermocouple since it is not exposed to the elements in the processing chamber.

Still further, the serviceability of lamp heated CVD chambers is more of a concern than with resistive heating systems. For example, because susceptors are required to carry the substrates into the process chamber in a lamp heating system, calibration between the mechanical components which transfer the susceptor and wafers between chambers can be problematic.

An exemplary CVD process which is useful for a variety of semiconductor applications is the dichlorosilane (DCS) tungsten silicide process. Because of the temperatures at which the DCS process occurs, conventional resistive heating systems are generally not suitable for the process as they are not capable of sustaining the required process temperature range (500°–600° C.). As a result, the process is performed in, for example, a halogen lamp heated CVD chamber. However, providing a resistive heating chamber in which a DCS process could take place would be advantageous.

In a DCS tungsten silicide process, the tungsten silicide film is formed by a reaction of $WF_6$, DCS, and $SiH_4$. As with other CVD processes, after processing a series of wafers, typically twenty-five, the chamber is cleaned to remove products of the reaction which have deposited on the walls of the reaction chamber and other components inside the chamber. During the cleaning process, the wafer holders remain in the CVD chamber.

Two different types of cleaning processes are generally utilized: chemical cleaning or plasma cleaning. Plasma cleaning involves generating a plasma using $NF_3$ and RF energy. As a result, plasma cleaning is more localized, but results in an uneven cleaning of the deposits since it is more difficult to control. If the plasma clean process is performed at temperatures in the 500°–600° C. range, the susceptor will be severely damaged and a great deal of particulate matter will be generated from the other components of the system. In addition, plasma cleanings are localized and less uniform. Chemical cleaning is more uniform, but is more stressful on the components of the chamber.

Chemical cleaning involves placing $ClF_3$ in the process chamber to produce a thermally dependant reaction which is more severe at higher temperatures. Chemical cleaning can damage the susceptor if not properly controlled. Chemical cleaning in chlorine tetrafluoride ($ClF_3$) at temperatures of 300° C.–600° C. is undesirable as it can cause both mechanical and chemical stresses on susceptors. For example, when using a glass carbon susceptor, the chemical cleaning must be conducted at a temperature of 200° C. This requires cooling the process chamber from the 500–600° C. DCS tungsten silicide processing temperature, thereby slowing the processing throughput of the chamber.

To date, radiant heating CVD systems have been preferable for use in processes like the DCS tungsten silicide process. Such systems are more resistant to heat stress and the chemical cleaning processes utilized in such process. However, it would be desirable to provide a resistive heating CVD chamber which can be utilized in the CVD process. This should bring to bear all the advantages of the cold wall resistive heating systems in the DCS process.

SUMMARY OF THE INVENTION

The invention, roughly described, comprises a resistive heating system for a process apparatus such as a chemical vapor deposition chamber. The system includes a resistive heating substrate holder including a support surface and a support shaft, the holder being comprised of a first material. The support surface includes a resistive heating element. The support shaft has a given length, and through bores for allowing a thermocouple to engage the support surface and electrical conductors to couple to the resistive heating element in the support surface.

A metallic mounting structure is coupled to the support shaft and secured to the process apparatus to create a sealed environment within the holder and mounting structure to protect the electrical leads and thermocouple from the process environment.

In one embodiment, a coupling structure is provided to secure the support shaft to the mounting structure. The coupling structure is optimized to provide rigid support with minimal thermal stress on the coupling. In this respect, the coupling structure may includes a support member made of the same material as the substrate holder and reduces thermal stresses induced by heating the substrate holder and support member.

The length of the shaft can be adjusted based on the materials used for the substrate holder and the mounting structure. This allows different materials to be used for the mounting structure and the substrate holder, and the materials may be optimized for the particular process in use in the process chamber. The length of the shaft may be adjusted based upon the materials used and the temperature of the process which the heating system is designed to support. In one embodiment, the holder and shaft comprise aluminum nitride and the mounting structure comprise nickel or a nickel alloy. By adjusting the length of the shaft, the temperature of the process is greater than the point at which the shaft and mounting structure are joined, and the temperature at the point of joinder can be optimized for the materials used.

In addition, the heater utilizes a control scheme which controls the power output of the resistive heating element based on the thermal resistivity of the heater structure.

BRIEF DESCRIPTION OF THE DRAWINGS

The invention will be described with respect to the particular embodiments thereof. Other objects, features, and advantages of the invention will become apparent with reference to the specification and drawings in which.

DETAILED DESCRIPTION

Figure 1:
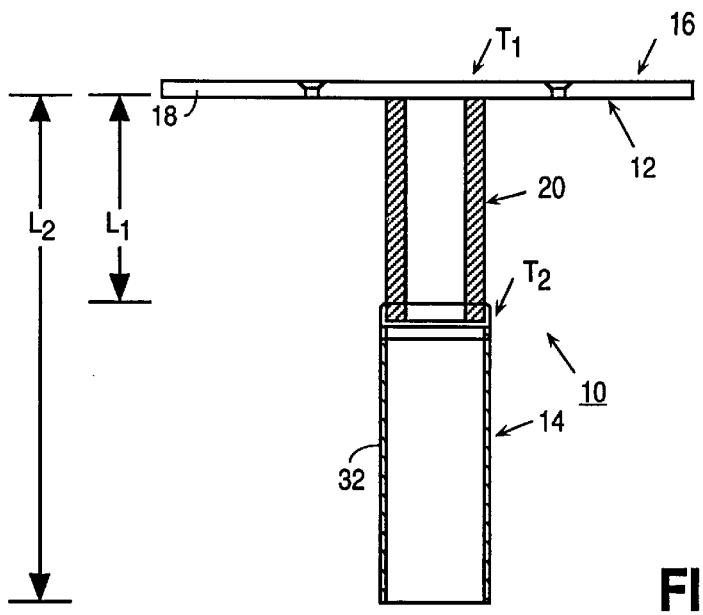
FIG. 1 is a cross-sectional view of a resistive heating structure in accordance with the present invention.

FIG. 1 shows a first embodiment of the resistive heating apparatus 10 of the present invention. The resistive heating apparatus 10 includes a resistive heating substrate holder 12 and a mounting structure 14. It will be understood that the resistive heating apparatus 10 is resident in a sealable processing chamber such as, for example, the chemical vapor deposition (CVD) chamber. Substrate holder 12 has a planar surface 16 upon which a substrate of semiconductor material may be placed for processing in a CVD chamber (not shown).

Resistive heating wafer holder 12 includes the wafer holding section 18 and a first support shaft 20. In one embodiment, wafer holder 18 and first support shaft 20 are manufactured from aluminum nitride. First support shaft 20 may be diffusion bonded to wafer holding section 18. Mounting structure 14 is manufactured from a strong metal material, which in one embodiment comprises nickel 200 (ANSI nickel 200) and secures the wafer holder 12 to the process chamber.

It should be recognized that alternative materials may be used to manufacture wafer holder 12, and mounting structure 14 without departing from the spirit and scope of the present invention. In the embodiment described herein, a relatively pure (99.97%) compound of aluminum nitride is utilized. It has been determined aluminum nitride of this composition in this embodiment is particularly advantageous in process environments with temperatures in the range of 500–600° C. The impurities in the AlN compound may comprise yttrium oxide ($Y_2O_3$) or carbon.

A unique aspect of one embodiment of the present invention is the combination of the use of first support shaft 20 comprised of a first material having a different thermal expansion coefficient than a second material comprising the mounting structure. This allows the materials used for each portion of the apparatus to be selected for optimal performance of the heating apparatus. For example, aluminum nitride has good heat and corrosion resistance qualities, while the nickel alloy has great strength and durability. Hence, in one embodiment, the aluminum nitride first support shaft 20 and holder 12 with the nickel mounting structure 14 to secure wafer holder 12 have been successfully implemented for use with a process temperature at surface 16 of wafer holder 12 of approximately 500° C. in, for example, the DCS process.

At this temperature, mounting the wafer holder 12 directly to the mounting structure 14 by coupling second support shaft 32 directly to holding section 18 would be problematic because at temperatures close to 500° C., the variance in the thermal expansion properties of the materials would create stresses which would weaken any conventional bonding techniques for joining the materials. Moreover, due to the nature of the chemical process in the process chamber, it would be difficult to maintain a secure bond between the metal mounting structure and the aluminum nitride wafer holder since repeated attack by the chemicals in the chamber would have a corrosive effect on the bond. Hence, in a first embodiment of the present invention, a first unique aspect of the invention is that the first support shaft 20 is manufactured to a specific length $L_1$ which provides a predetermined temperature drop between the temperature $T_1$ at the surface 16 of wafer holder 12 and a second temperature $T_2$ at the point where the first support shaft 20 is joined to the mounting structure 14. The difference or drop between $T_2$ and $T_1$ is determined by the materials used in each section, and the process temperature $T_1$ at the surface 16, thus yielding a length $L_1$ which is required for first support shaft 20.

In a second embodiment, the first support shaft 20 may be provided with a length ($L_2$) equivalent to the total length of the distance between the wafer holder 12 and the mounting hardware in the chamber. However, this increases the complexity of forming the conduits in the shaft which are necessary to provide the thermocouple and electrical conductors to the resistive heating element in wafer holder 12. Although formation of an aluminum nitride shaft of such a length would increase the cost of the structure as a whole, such embodiment is considered within the scope of the invention.

In a further unique feature of the present invention, internal conduits are provided to allow a thermocouple and conductive leads to be positioned in a controlled environment within the heating apparatus, isolated from the chemical reaction in the chamber. In some systems, exposed terminals which are utilized in metal chemical vapor deposition chambers can eventually be shorted by the deposition of metal in the chemical process. Hence, it is preferable to provide such terminals inside of the substrate mounting structure. In the system of the present invention, the process occurring in a vacuum has does not interact with the thermocouple and the electrical conductors in the interior of the shaft. The controlled environment inside the shaft may be maintained at atmosphere, isolated from the process chamber at vacuum.

Figure 2A:
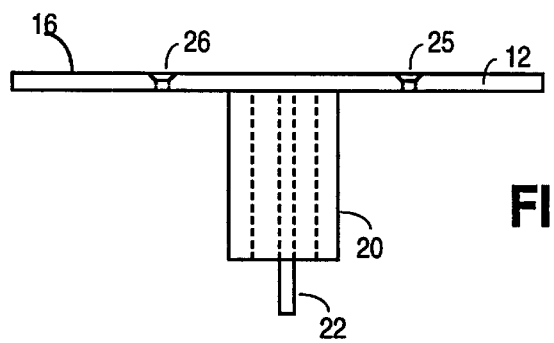
FIG. 2A is a first side view of a resistive heating wafer holder in accordance with the present invention.
Figure 2B:
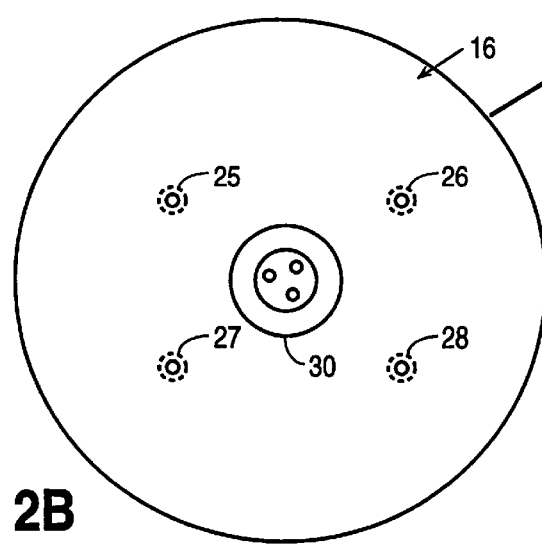
FIG. 2B is a top view of a resistive heating wafer holder in accordance with the present invention.
Figure 2C:
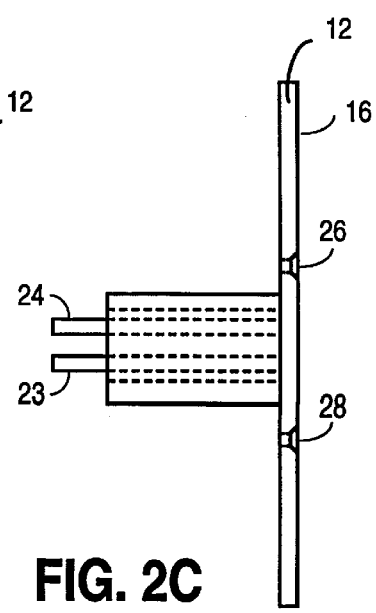
FIG. 2C is a second side view of a resistive heating wafer holder in accordance with the present invention.

The resistive heating wafer holder 12 and first support shaft 20 are shown in further detail in FIGS. 2A–2C. As shown therein first support shaft 20 includes a first conduit 22 in which a thermocouple may be provided, and second and third conduits 23,24 in which electrical conductors to the resistive heating elements positioned in substrate holder 12 may be provided. Through bores 25,26,27,28 are provided in surface 16 to enable substrate lifting fingers to pass through wafer holder 12 to raise and lower substrates onto surface 16 of resistive heating structure 10. A thermocouple insert region 30 is provided at the center of surface 16 of resistive substrate holder 12.

Figure 3:
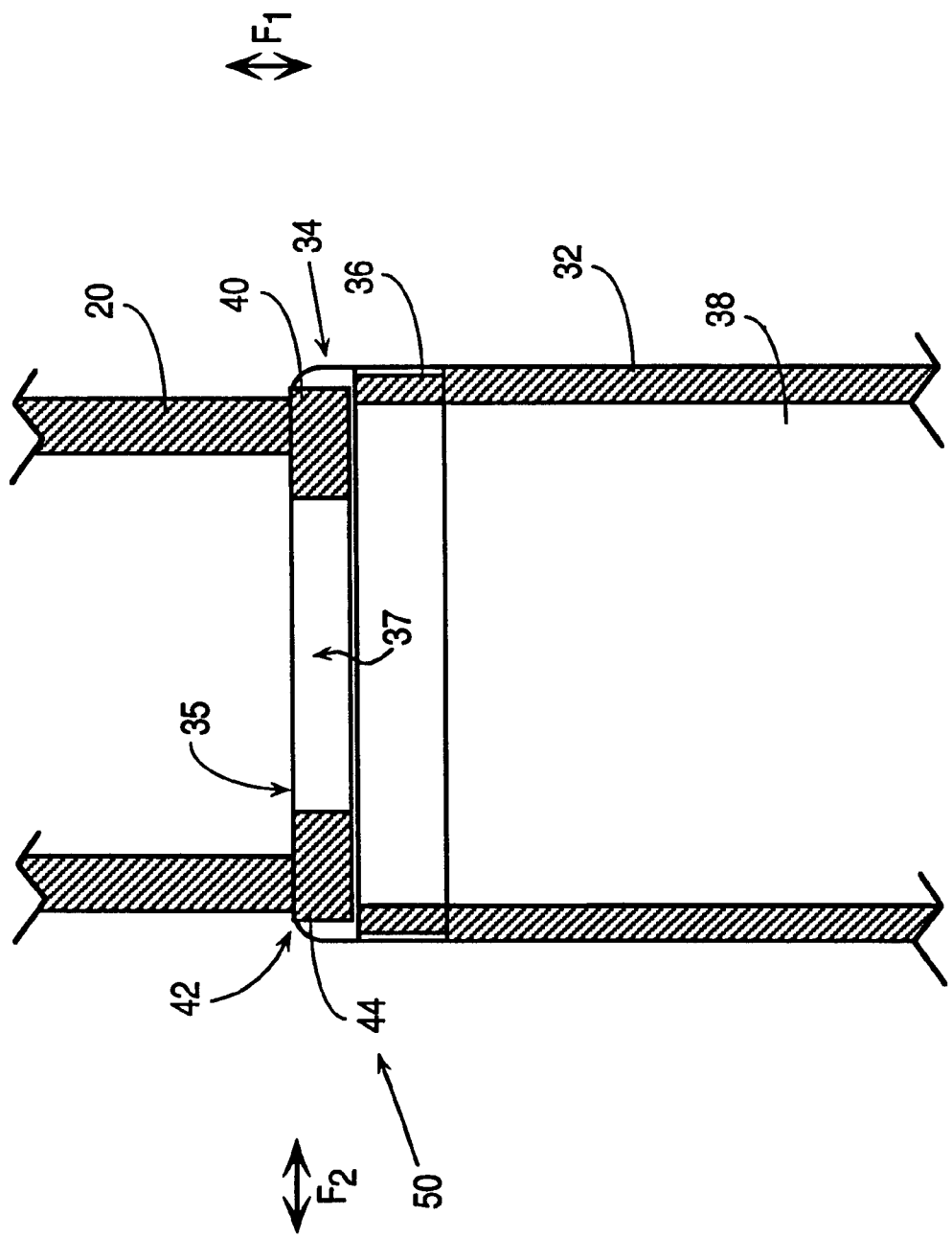
FIG. 3 is a close-up cross-section of a first mechanism for coupling the mounting structure with a resistive heating wafer holder.

A first embodiment of the mounting structure 14 using a first coupling structure 50 is shown in FIGS. 1 and 3. Coupling structure 50 is critical because it must support the entire wafer holder structure 12 and first support shaft 20. Mounting structure 14 includes a shaft 32 and bellows member 34 which is slidably received over end portion 36 of second support shaft 32. Bellows member 34 includes a first surface 35 which engages first support shaft 20 of the substrate holder 12. The second surface 37 faces the interior region 38 of second support shaft 32. Interior region 38 of second support shaft 32 will, once bellows member 34 has been secured to second support shaft 32, become a controlled environment which is generally maintained at atmosphere during the chemical vapor deposition process. A support disk 40 which has a diameter roughly equivalent to the diameter of fist support shaft 20 abuts the lower surface 37 of bellows member 34. Bellows member 34 is secured to second support shaft 32 by an E-beam weld.

Bellows member 34 is provided to allow some flexibility between the first support shaft 20 and nickel second support shaft 32. Bellows member 34 may be comprised of nickel, but is generally thinner (having a thickness of about 2 mil.) than the nickel material which comprises second support shaft 32. Because aluminum nitride and nickel have different thermal expansion coefficients, when heated, the flexing allows the expansion between the shafts to occur at different rates while maintaining a good seal. This thermal expansion is the key problem which must be overcome in adapting the coupling of first support shaft 20 to second support shaft 32.

While an E-beam weld may be used to attach the bellows member 34 to second support shaft 32, brazing is utilized to attach aluminum nitride first support shaft 20 to bellows member 34. The first brazing occurs at the interface between first support shaft 20 and surface 35 of bellows member 34. The second brazing occurs at interface 44, between disk member 40 and surface 37 of bellows 34. Disk member 40 is a counter-stress member manufactured of aluminum nitride and provides for thermal expansion matching between the first support shaft 20 and bellows member 34. The bellows member allows for expansion of first support shaft 20 and second support shaft 32. Without the flexing of the bellows member, the brazing will be insufficiently strong to resist breaking due to the stress resulting during heating and the thermal expansion differential between the aluminum nitride first support shaft 20 and second support shaft 32. Generally, nickel expands more than aluminum nitride. As a result, there will be a vertical tensile stress ($F_1$) on the braze. Because ring 40 is aluminum nitride, it will be less expansive and will divide this force by two. Hence, the tensile stress becomes compression and the strain is more even. Likewise, stress along the direction indicated by $F_2$ in FIG. 3 is also reduced by two due to the presence of ring 40.

The brazing utilized is a silver/copper material and cannot sustain the attack of the chlorine tetrafluoride ($ClF_3$) utilized in the cleaning process. As a result, the braze is plated with nickel 200 at a thickness of approximately 1 mm. over the braze to secure and prevent contamination of the braze from chemical attack.

It should be recognized by one of average skill in the art that length $L_1$ is chosen in FIG. 1 based on the desired temperature at the coupling point between the first support shaft 20 and second support shaft 32. $L_1$ may vary based on the use of the materials utilized in structure 10 and the nature of the process within which structure 10 is intended to operate.

Figure 4:
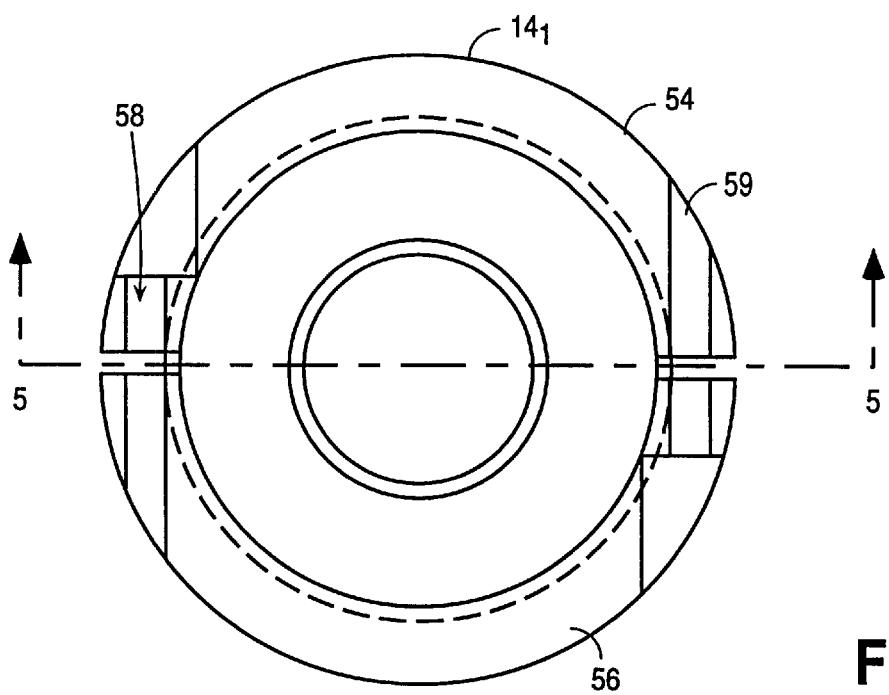
FIG. 4 is a top view of a second embodiment of the mounting structure in accordance with the present invention.
Figure 5:
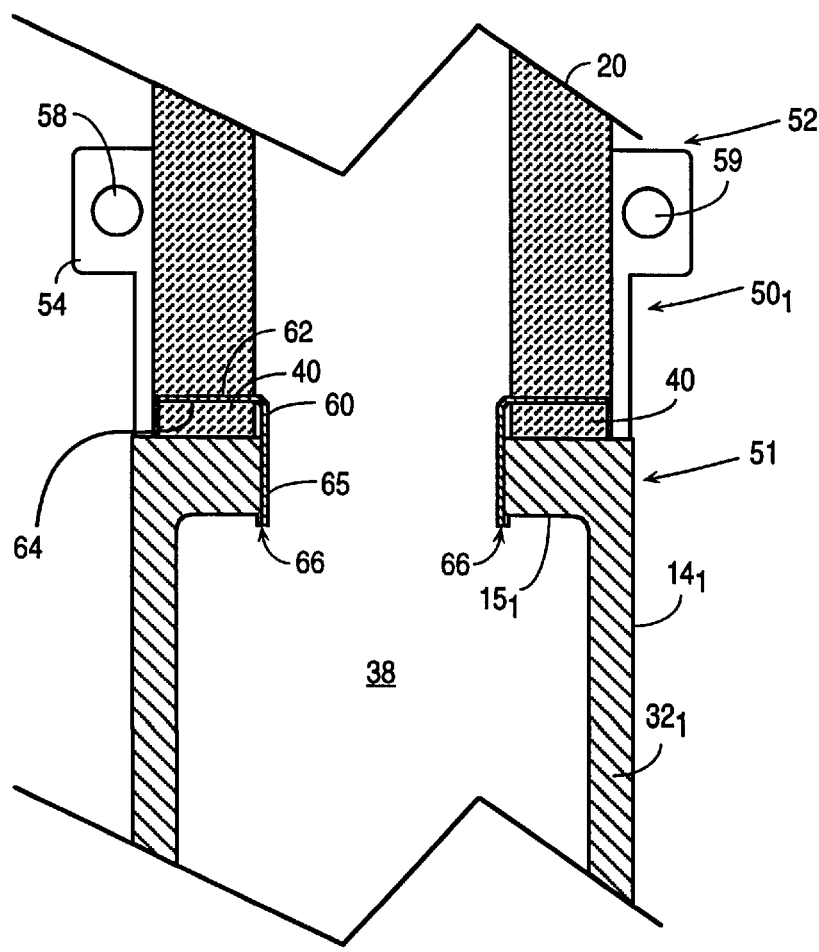
FIG. 5 is a cross-sectional view of the mounting structure shown in FIG. 4 showing the manner in which the mounting structure is utilized to couple to the resistive heating wafer holder in a second embodiment of the present invention.

FIGS. 4–8 show a second embodiment of the present invention, specifically showing a coupling structure $50_1$ for securing first support shaft 20 to mounting structure $14_1$. In this embodiment of the coupling structure, mounting structure $14_1$ includes a clamp to provide additional support for the coupling. The mounting structure $14_1$ is essentially similar to mounting structure 14 except that a clamp coupling 52 at the end of the mounting structure 14 is provided. FIG. 4 is a top view, and FIG. 5 a view along 5–5 in FIG. 4, of the second embodiment of the present invention. As shown therein, mounting structure $14_1$ has a first end 51 which includes a clamp 52 formed by an annular member 54 and clamp member 56. Threaded through bores 58,59 are provided in clamp member 56 and annular member 54 to secure first support shaft 20 into place in mounting structure 14 using bolts (not shown).

In order to provide a secure environment isolated from the process chamber at the interior portion 38 of mounting structure $14_1$, an L-shaped ring 60 manufactured of 2 mil. thick nickel-200 rests between first support shaft 20 and aluminum nitride support ring 40 in the interior region 38 of the second embodiment of the present invention. A braze is used at the interface 62 between first support shaft 20 and L-shaped ring 60 and a second braze is used at interface 64 between ring 40 and a lower surface of L-shaped ring 60. An E-beam weld is utilized at point 66 at the interface of the inner ring 65 and lip $15_1$ of mounting structure $14_1$. Welding provides a vacuum seal for the interior region 38 of the shaft first support $32_1$. This separates the functions of providing a vacuum seal to the interior portion 38 and supporting the resistive heating substrate holder 12.

Hence, the interior of the mounting structure and shaft first support 32 are a controlled environment isolated from the vacuum of the process chamber. This allows the thermocouple and electrical conductors for the heating element to be maintained at atmospheric pressure, thereby isolating them from the effects of the process in the chamber and increasing their lifetime and the overall robustness of the heater structure.

Figure 6:
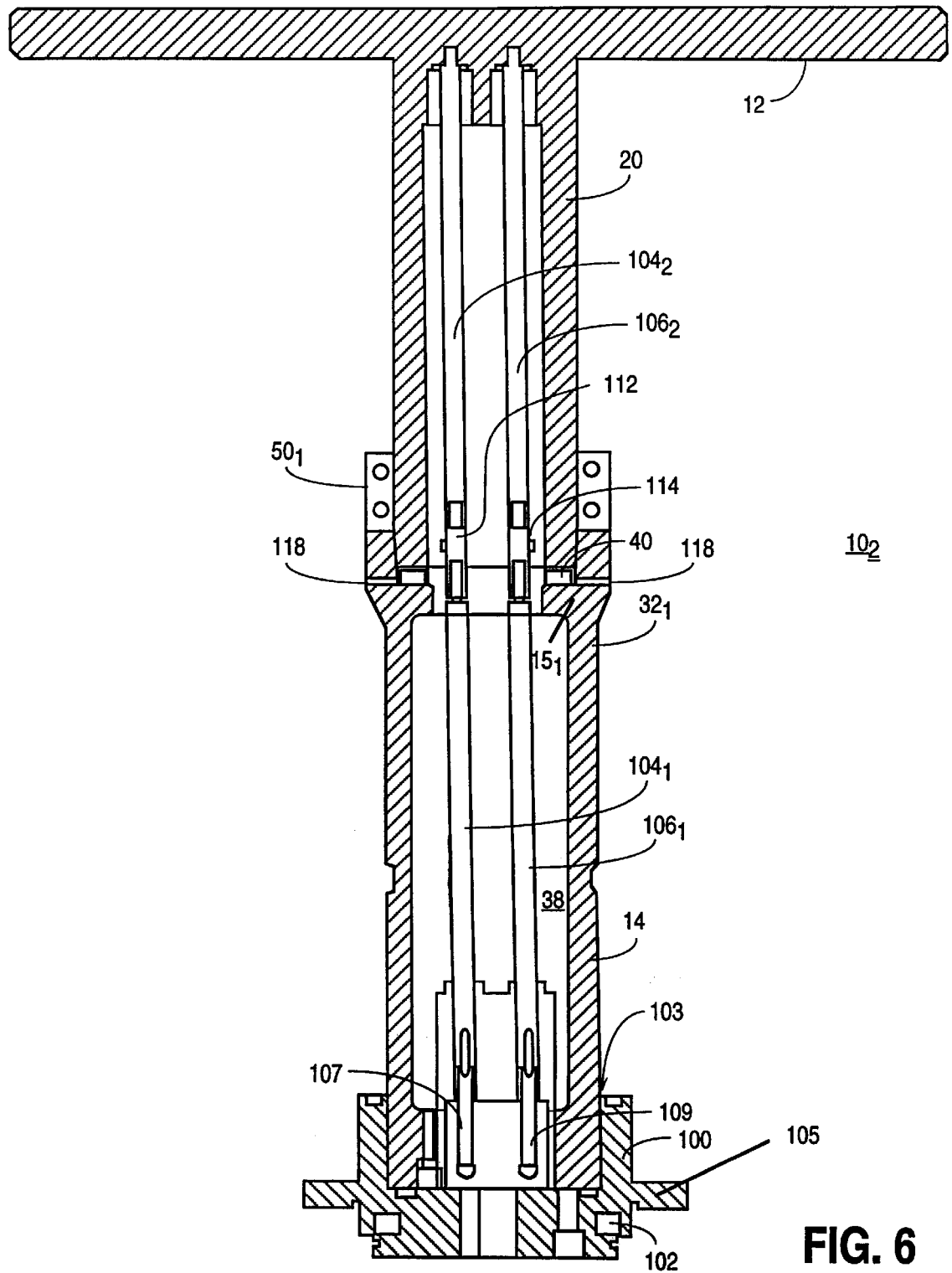
FIG. 6 is a cross-sectional view of a resistive heating structure showing the conduits for conductive leads coupled to the resistive heating element in the wafer holder.

FIG. 6 shows a side view cross-section of the resistive heating structure 10 including the second embodiment of the coupling structure $50_1$ and the electrical conduits 108,110 which couple the resistive heating elements in the wafer holder 12 to the device. Reference numerals are utilized to represent like parts in previous figures. As shown in FIG. 6, a chamber mount 100, which will typically be coupled to a chemical vapor deposition chamber or other processing chamber (not shown) is provided in the chamber to secure the mounting structure 14. The chamber mount includes fluid conduits 102 which may be provided for water cooling of the heating structure 10. A bore 103 is provided in chamber mount 100 to receive the mounting structure 14 or $14_1$. Flange 105 of chamber mount 100 will rest on the chamber wall and help support the heating structure. Electrical connectors 107,109 are provided in chamber mount 100 and are coupled to conduits $104_1, 106_1$. Electrical conduits $104_1, 106_1$ in the mounting structure 14 are located at interior region 38 in a controlled environment. Corresponding conduits $104_2, 106_2$ in shaft first support 20 are coupled by electrical connectors 112,114 located at the interface between first support shaft 20 and second support shaft 32 to conduits $104_1, 106_1$. Outgassing ports 118 are provided at the interface of first support shaft 20 and lip $15_1$ to allow for seating of the support ring 40 thereby enabling gas to escape and the formation of a controlled environment at the interior region 38.

Figure 7:
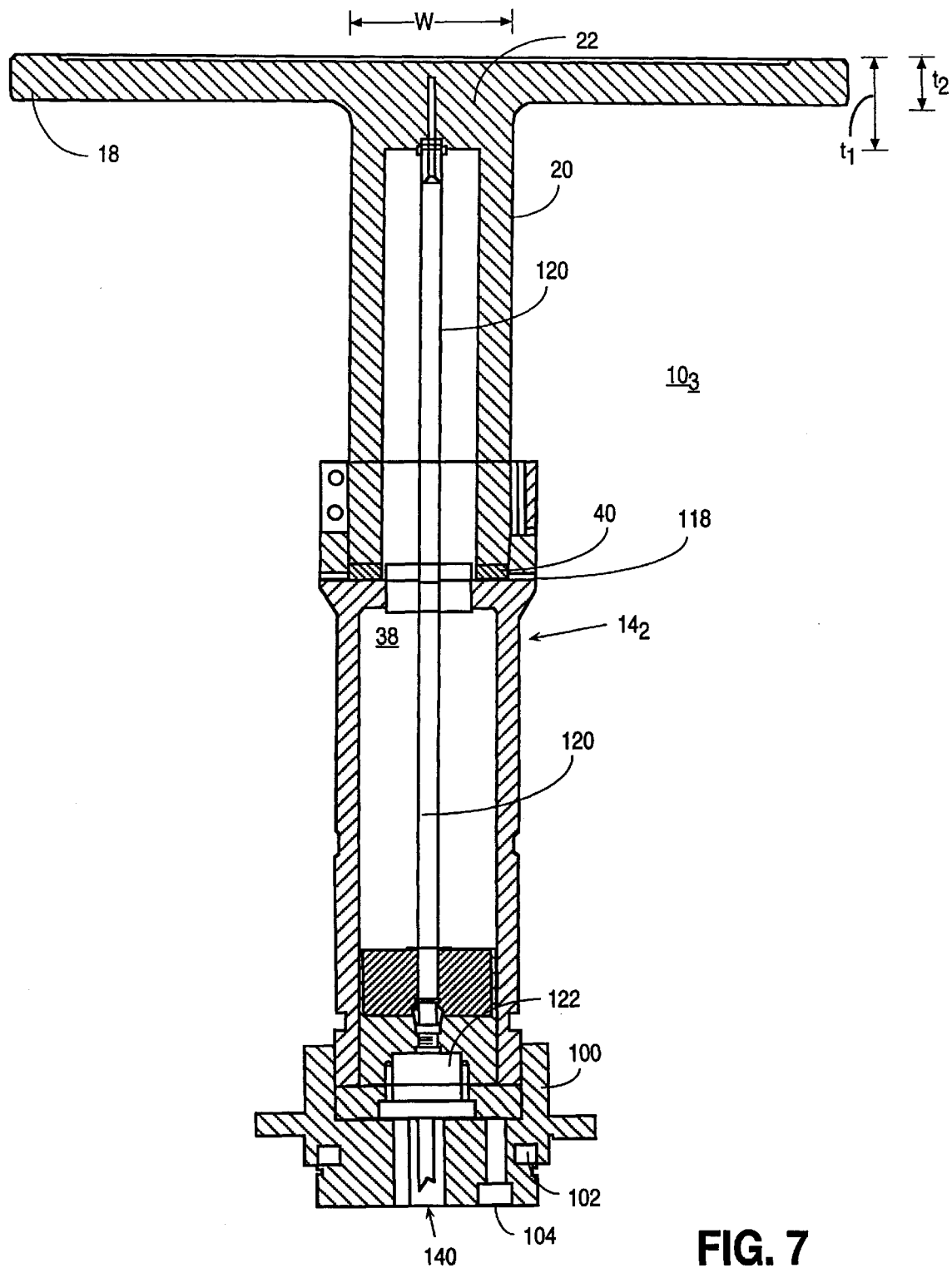
FIG. 7 is a second cross-sectional view of a resistive heating structure in accordance with the present invention showing a conduit and thermocouple coupling with the resistive heating element in accordance with the present invention.

FIG. 7 shows a similar cross-section of the embodiment of the heating structure shown in FIG. 6, but illustrating a thermocouple 120 in place in the controlled environment in region 38. As shown therein, a connector 122 for thermocouple 120 is provided in chamber mount 100. A bore 140 in mount 100 allows connection of the thermocouple 120 to the CVD system. As noted above, the thermocouple is maintained at atmosphere within the bore.

Illustrated in FIG. 7 is a further unique aspect of the present invention involving increasing the accuracy of the temperature measured by the thermocouple 120 at its intersection with the substrate holder. At region 22 comprising the intersection of shaft first support 20 with wafer holding section 18, the thickness t1 of the aluminum nitride is greater than the thickness t2 of the wafer holding region 18 over the width (diameter) of the shaft first support 20. This increase in thickness compensates for heat loss at the center of the wafer holding regions. The use of the thermocouple at the center of the wafer holding region will itself increase the heat loss in the region due to the necessity for the conduit to be provided into the aluminum nitride under the wafer holding surface. Also, the fact that the thermocouple is provided at atmosphere will increase heat loss as the heat loss of a body at atmosphere is greater than one at vacuum. If the thickness of the aluminum nitride in region 22 were the same as that in region, the heat loss in this region would be greater than that over the balance of the wafer holding region 18. Therefore, the thickness of the aluminum nitride in this region is increased to reduce heat loss.

An alternative solution to this increasing the thickness of this region is to increase the density of the material in region 22 while maintaining the same thickness t2 of the wafer holding region. Such a solution would likely increase the complexity of forming the structure and would increase the thermal stress in region 22.

In a further unique aspect of the invention, the thickness t2 of the wafer holding region 18 is chosen so as to control the heat ramp rate of the heating structure of the present invention. Conventionally, the thickness of a resistive heater is on the order of 0.7 inch. As should be generally understood, the greater the thickness, the slower the ramp rate of the heater. However, in one embodiment of the present invention, the thickness t2 is on the order of about 0.5 inch. This enables a much quicker cool down time for the heater.

Heater ramping control in the heating structure of the present invention is particularly important to achieve precise control over the process occurring in the CVD chamber, and to avoid thermal cracking of the heater and prevent excessive heater idle time. Cracking will result if the rate of temperature change is too great, while the overall throughput of the CVD system will be compromised if the rate of change is too low.

Hence, in a further unique aspect of the present invention, a scheme for controlling the rate of heating and cooling in the heater structure of the present invention is utilized. In the present system, the heating element is comprised of molybdenum, due to the fact that the thermal expansion coefficient of molybdenum is the same as that of aluminum nitride. It should, however, be understood that the unique features of the heater of the present invention will be applicable to resistive heating elements of many different types of materials.

In a ceramic heating system, such as that described herein, the resistivity of the heating element increases with temperature. This complicates the control of the temperature ramp rate of the heater structure. The change in resistivity can be as high as three times as the temperature is increased from room temperature to 600° C. Thus change in resistivity can, in turn, greatly affect the power output of the heater.

Generally, heater element control can take place by either current or voltage regulation. The power output of the heater is equivalent to:

$$power=(voltage)^2/resistivity$$

This means that, for a small voltage or current input, the power output of the heater is reduced at the temperature or resistivity increases. Although prior art resistive heating elements have utilized error compensations schemes which take into account the error between the actual voltage input and the true voltage input, none have compensated for the variation in the resistivity of the heater material which results from increases in temperature. For example, the so-called PID (proportional integral differential) error correction algorithm is commonly used.

In the heater system of the present invention, a heater control scheme is utilized which varies the voltage input by adjusting the voltage input to compensate for the change in the resistivity of the heater element material as the temperature of the heater increases. Generally, this scheme implements the following equation to control the input voltage:

$$True\ voltage\ input=(calculated\ voltage\ input) \times f1\ (t)$$

for voltage mode control, or $$True\ current\ input=(calculated\ current\ input) \times f2(t)$$

for current mode control, where: the calculated voltage input is derived from any control algorithm of the heater element without considering the effect of the resistivity change; and f1,f2 are any functions of temperature to justify resistivity variation due to temperature change.

It should be understood that functions f1 and f2 will vary depending on the particular material used in the heater element, and such functions can be varied depending on the accuracy one wishes to achieve. These functions can be implemented in the circuitry which directly controls the voltage or current regulator or they can be implemented in the software ported to the processor of choice which controls the voltage or current regulator. It should be readily recognized that there are numerous types of control processors and software implementations which may be utilized to implement this function of the heater of the present invention.

Figure 8:
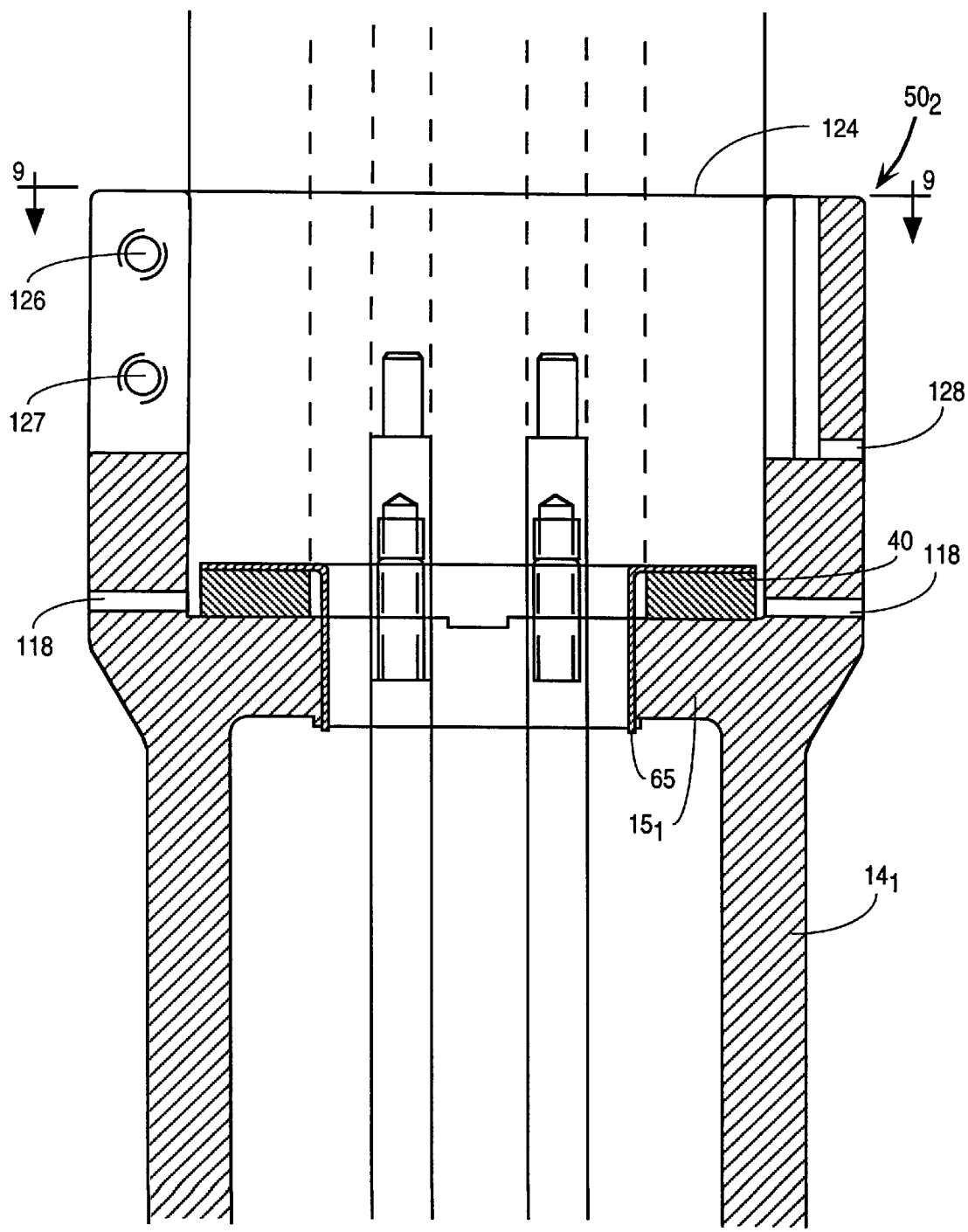
FIG. 8 is an enlarged view of a cross-section of a third embodiment of the mounting structure engaging the resistive heating wafer holder in accordance with the present invention.
Figure 9:
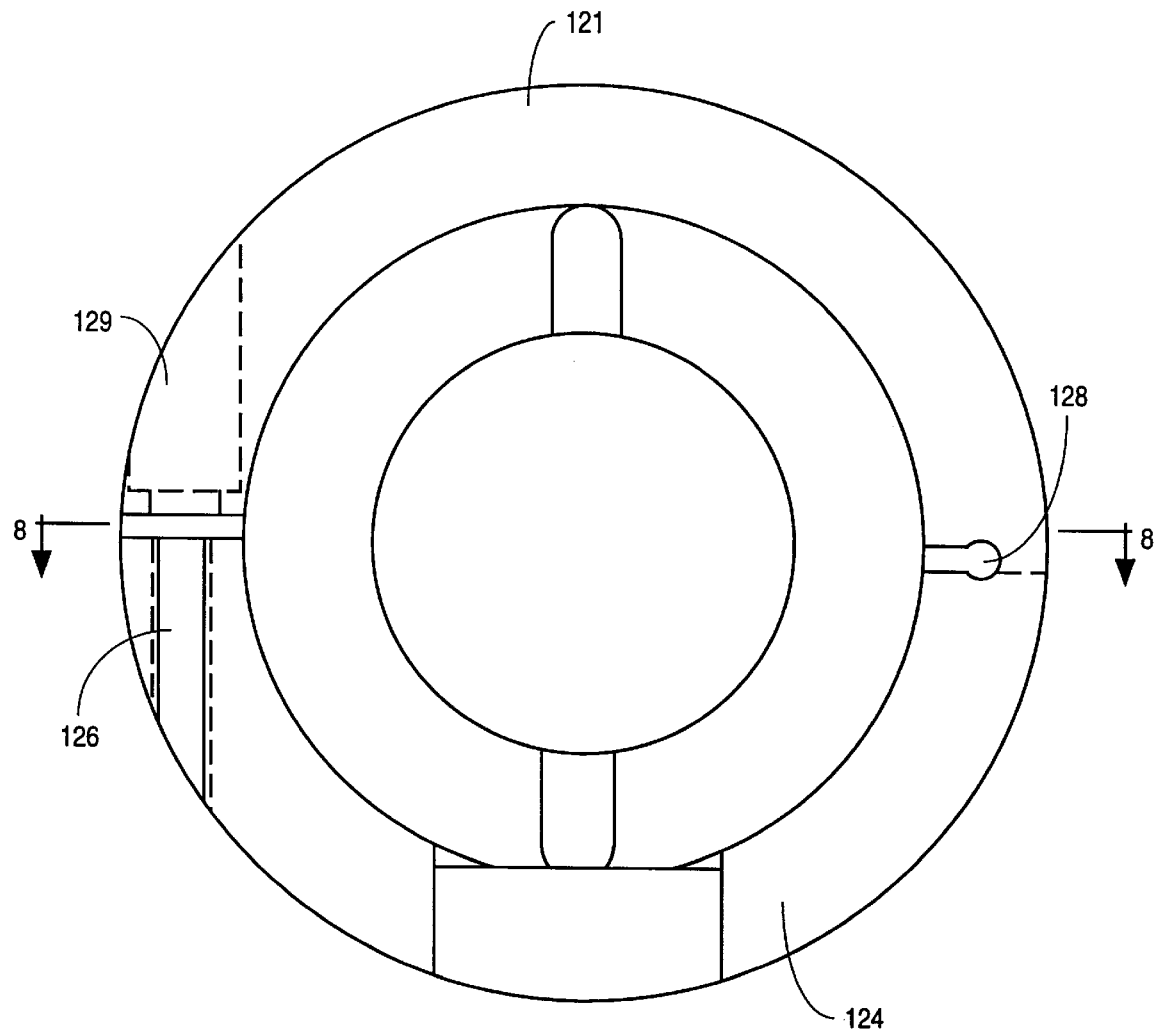
FIG. 9 is a cross-section along line 9—9 in FIG. 8.

FIGS. 8 and 9 show cross-sections of a third alternative embodiment for the clamp member $50_2$. In this embodiment, the clamp member $50_2$ comprises a single formed arcuate portion 124 having an opposing clamp arm 121. Two through bores 126,127 are provided to secure the clamp arm against the arcuate clamp member 124, and corresponding through bores 128 (illustrated only in FIG. 8 relative to bore 126) are provided in clamp arm 121. The structure shown in FIG. 8 has been determined to be extremely secure and allows for reduced fixtures relative to the embodiment shown in FIGS. 4 and 5.

The many features and advantages of the present invention will be apparent to one of average skill in the art. All such features and advantages of the present invention are intended to be within the scope of the invention as defined by this application, and the attached claims.

What is claimed is:

1. A resistive heating apparatus for a chemical vapor deposition chamber, comprising:
    a substrate holding member comprised of a first material having a first thermal expansion coefficient, including a wafer support region and a support shaft supporting the wafer support region, the support shaft having a length; and
    a mounting member comprised of a second material having a second thermal expansion coefficient, coupled to the support shaft at a coupling point;
    wherein the length of the shaft is determined based on a process temperature occurring at the wafer support region such that a temperature at the coupling point is less than the process temperature and the expansion induced by any variance in the thermal expansion coefficients is minimized.

2. The apparatus of claim 1 further including a coupling structure joining the support shaft and the mounting member.

3. The apparatus of claim 2 wherein the coupling structure includes:
    a bellows member having a first side and a second side, and a first end and a second end, the first and second ends of the bellows member engaging the mounting structure, the first side of the bellows member engaging the support shaft; and
    a counter-stress member, positioned on the second side of the bellows member and opposing the support shaft.

4. The apparatus of claim 3 wherein the support member is brazed to the first side of the bellows member, and aligned with the counter-stress member, and counter stress member is brazed to the second side of the bellows member.

5. The apparatus of claim 2 wherein the coupling structure includes a clamp member formed in the mounting structure surrounding an end of the support shaft, an isolation member formed of the second material positioned at the base of the support shaft and in the clamp member, and a support ring formed of the first material and positioned between the mounting shaft and the isolation member.

6. The apparatus of claim 5 wherein the isolation member is brazed to the support shaft and the support ring.

7. The apparatus of claim 1 wherein the wafer holding region includes a resistive heating element formed therein.

8. The apparatus of claim 7 wherein the process temperature is greater than 450° C.

9. The apparatus of claim 8 wherein the temperature at the coupling point is less than 300° C.

10. The apparatus of claim 1 wherein the support shaft includes a first and second conduits supporting first and second electrical conductors.

11. The apparatus of claim 10 wherein the support shaft includes a thermocouple conduit.

12. The apparatus of claim 11 wherein the mounting shaft is coupled to the support shaft that the first and second conduits and thermocouple conduits are provided in a controlled environment isolated from the process in the chamber.

13. The apparatus of claim 1 wherein the first material is aluminum nitride.

14. The apparatus of claim 1 wherein the second material is nickel or a nickel alloy.

15. The apparatus of claim 1 wherein the support shaft is secured to the wafer support region by die bonding.

16. A resistive heating system for a chemical vapor deposition apparatus, comprising:
    a resistive heating wafer holder including a support surface and a support shaft, the holder being comprised of a first material, the support shaft having a given strength, the support surface including a resistive heating element, the holder including through bores for allowing a thermocouple to engage the support surface and electrical conductors to couple to the resistive heating element in the support surface; and
    a metallic mounting structure coupled to the support shaft to create a sealed environment within the holder and mounding structure to protect the electrical leads and thermocouple from the process environment.

17. The system of claim 16 wherein the support shaft and the mounting structure are coupled by a coupling system, the coupling system comprising:
    a bellows member having a first side and a second side, and a first end and a second end, the first and second ends of the bellows member engaging the mounting structure, the first side of the bellows member engaging the support shaft; and
    a support member, positioned on the second side of the bellows member and opposing the support shaft.

18. The system of 17 wherein the support member has a thermal expansion coefficient which is about the same as that of the support shaft.

19. The apparatus of claim 18 wherein the support shaft is brazed to the first side of the bellows member, and aligned with the support member, and the support member is brazed to the second side of the bellows member.

20. The apparatus of claim 17 wherein the coupling structure includes a clamp formed in the mounting structure surrounding an end of the support shaft, an isolation member formed of the second material positioned at the base of the support shaft and in the clamp member, a support ring formed of the first material and positioned between the mounting shaft and the isolation member.

21. The apparatus of claim 20 wherein the clamp includes an arcuate portion of the mounting structure, and a clamp arm.

22. The apparatus of claim 19 wherein the isolation member is brazed to the support shaft and the support ring.

23. The apparatus of claim 16 wherein the wafer holder includes a resistive heating element formed therein.

24. The apparatus of claim 22 wherein the wafer holder supports a process temperature of greater than 450° C.

25. The apparatus of claim 23 wherein the support shaft includes a first and second electrical conductors coupled to the resistive heating element.

26. The apparatus of claim 23 further including a thermocouple.

27. The apparatus of claim 26 wherein the electrical conductors and thermocouple are provided in a controlled environment isolated from the process in the chamber within the mounting structure and support shaft.

28. The apparatus of claim 16 wherein the first material is aluminum nitride.

29. The apparatus of claim 16 wherein said metallic mounting structure comprises nickel or a nickel alloy.

30. A heater for a chemical vapor deposition system, comprising:
   a first portion including a substrate mounting surface comprised of a material and a resistive heating element integral to the substrate mounting surface, the first portion further including a support arm bonded to the substrate mounting surface and comprising the same material as the mounting surface, the mounting arm having a length;
   a second portion including a mounting structure adapted to receive the mounting arm and through bore providing a controlled environment when the mounting structure is coupled to the mounting arm; and
   a coupling, comprising a portion of the mounting structure, a stress support ring, and a seal.

31. The heater of claim 30 wherein:
   the portion of the mounting structure includes a bore on the end of the mounting structure having a clamp section, the clamp section surrounding the bore, wherein the mounting arm is slidably received in the clamp and the bore;
   a support member, positioned between the base of the bore and the mounting arm; and
   a bellows member, positioned between the support member and the mounting arm.

32. The system of claim 31 wherein:
   the coupling further includes a bellows member having a first side and a second side, and a first end and a second end, the first and second ends of the bellows member engaging the mounting structure.

33. The system of 31 wherein the stress support ring has a thermal expansion coefficient which is about the same as that of the support arm.

34. The apparatus of claim 30 wherein the support arm is brazed to a first side of the seal, and aligned with the stress support ring member, and stress support ring is brazed to the second side of the seal.

35. The apparatus of claim 31 wherein the portion of the mounting structure comprises a clamp member formed in the mounting structure surrounding an end of the support arm.

36. The apparatus of claim 35 wherein the clamp member comprises an annular portion and a clamp arm.

37. The apparatus of claim 30 wherein the mounting structure is coupled to the support arm such that a controlled environment isolated from the process in the chamber is provided.

38. A heating element for a metal chemical vapor deposition chamber, comprising:
   a wafer carrying member having a wafer support surface and a support shaft coupled to the wafer support surface, the wafer carrying member and the support shaft being comprised of a heat resistant material having a first thermal expansion co-efficient, the wafer support surface having a resistive heating element and a first through bore including means for coupling the heating element to electrical leads, the support shaft including first through bores for carrying the electrical leads and a second through bore coupling a thermocouple;
   a mounting member comprised of a second material having a second thermal expansion co-efficient, the mounting member including a through bore associated with the first through bore for carrying the electrical conductors and the thermocouple, the mounting member including a clamp; and
   means for coupling the mounting member to the wafer carrying member at the clamp and providing a controlled environment in said through bores.

* * * * *